Sept. 22, 1953 B. S. VILKOMERSON 2,653,224
FREQUENCY CONVERTER SYSTEM
Filed April 29, 1949
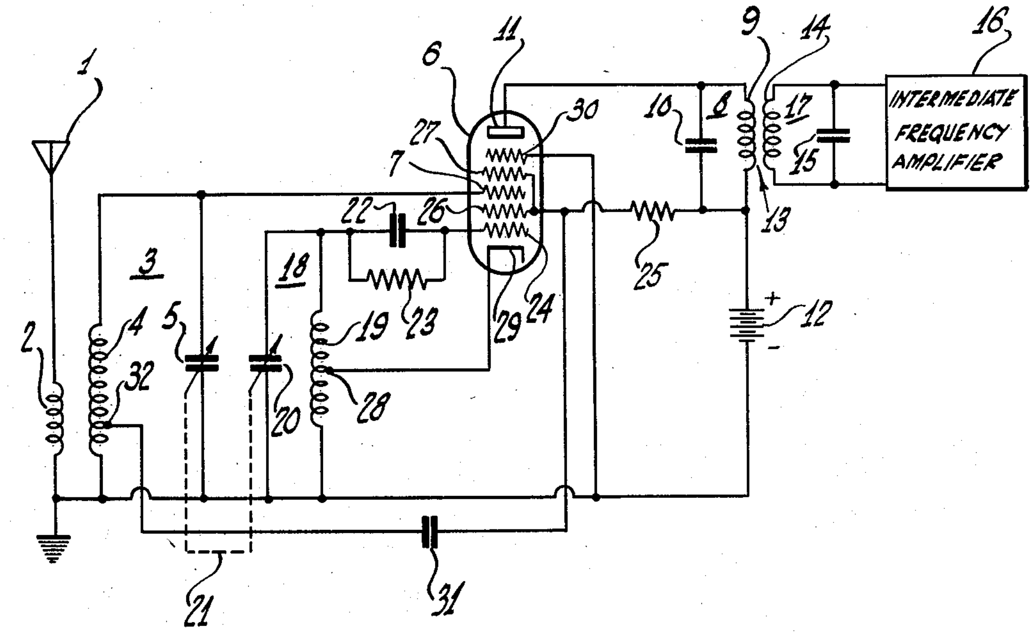
INVENTOR
BENJAMIN S. VILKOMERSON
BY H. K. Newton
ATTORNEY Patented Sept. 22, 1953 2,653,224

UNITED STATES PATENT OFFICE 2,653,224

FREQUENCY CONVERTER SYSTEM

Benjamin S. Vilkomerson, Camden, N. J., assignor to Radio Corporation of America, a corporation of Delaware Application April 29, 1949, Serial No. 90,416

7 Claims. (Cl. 250—20)

This invention relates to frequency converter systems and has particular reference to systems of such character employing electron discharge tubes of the pentagrid converter type.

In superheterodyne radio receivers, pentagrid converter tubes are frequently employed for frequency conversion purposes. A tube of this character has, in addition to an electron emitting cathode and a plate anode, a plurality of grids and is adapted for electronic signal mixing. As is well known, it may serve the dual purpose of local oscillator and first signal detector, whereby signal-modulated radio frequency waves, for example, may be converted to signal-modulated intermediate frequency waves. Also, in systems of this character it is usual to couple the signal anode, which in most cases is the plate of the tube, to an intermediate frequency transformer. Inasmuch as this transformer is tuned for resonance at the intermediate frequency which ordinarily is lower than the radio frequency, it represents a capacitive load in the plate circuit at the radio or signal frequency. Such an arrangement frequently produces degeneration and consequently lowers the conversion efficiency of the device.

In some cases, by suitable selection of the converter tube and/or by proper circuit design, this degeneration effect may be decreased somewhat, thereby increasing the frequency conversion gain. Whether or not this can be conveniently accomplished, it always is desirable to effect the maximum possible frequency conversion gain. Such a result is particularly desirable in the smaller radio receivers in order to keep to a minimum the number of signal amplifying stages.

It, therefore, is an object of the present invention to provide an improved frequency converter system which is capable of producing higher conversion gains than prior known frequency converters of this type.

Another object of the invention is to provide a novel frequency converter system which will produce higher conversion gains without adding to the cost of a radio or like receiver or substantially modifying the circuit design.

A further object of the invention is to provide a novel frequency converting system in which there is a controlled regenerative feedback effective in the signal input circuit for enhancing the signal conversion gain without introducing oscillations.

In accordance with the present invention, there is provided a frequency converter system employing an electron discharge device or tube of the multi-grid type which functions both as a local oscillator and as the first detector in a superheterodyne receiver circuit. The electron discharge device includes an electron emitting cathode, an oscillator grid, one or more screen grids, one of which serves as the oscillator anode, a signal grid, and an output plate anode. A frequency-determining circuit tunable to a desired oscillator frequency is coupled between the oscillator anode and the oscillator grid. Also, there is provided a signal-modulated radio frequency wave input resonant circuit tunable to a desired radio or signal frequency and an output resonant circuit tunable to an intermediate frequency. The intermediate frequency wave output resonant circuit is coupled to the output anode. Means also are provided for coupling both the signal input grid and the oscillator anode to the radio frequency input resonant circuit.

Further, in accordance with the present invention, and as a feature thereof, the signal grid is coupled to a relatively high potential point of the radio frequency input resonant circuit and the oscillator anode is coupled to a relatively low potential point of the input resonant circuit. The point at which the oscillator anode is coupled to the input resonant circuit should be one of a potential which is of insufficient magnitude to produce oscillations at the signal frequency but at the same time one which is of sufficient magnitude to effect appreciable regeneration at the signal frequency.

The novel features that are considered characteristic of this invention are set forth with particularity in the appended claims. The invention itself, however, both as to its organization and method of operation, as well as additional objects and advantages thereof, will best be understood from the following description taken in connection with the accompanying drawing.

The single figure of the accompanying drawing is a circuit diagram of a frequency converting system embodying the invention.

Having reference now to the drawing, there is shown only that portion of a radio receiver which is necessary for an understanding of the invention. Signal-modulated radio frequency carrier waves are intercepted by an antenna 1, which is coupled to a coil 2. A radio frequency input resonant circuit 3, tunable to the frequency of the received carrier waves, includes the parallel connection of a coil or winding 4, and a variable resonating or tuning capacitor 5. The coil 4 is inductively coupled to the antenna coil 2.

A frequency converter tube 6 which may, for example, be of the type RCA 6SA7 is provided to serve the dual functions of a local oscillator and a first signal detector. The radio frequency input resonant circuit 3 is coupled to the signal grid 7 of the tube 6. An output resonant circuit 8, tuned to an intermediate frequency and comprising the parallel connection of a coil 9 and a resonating capacitor 10, is coupled between the output anode 11 of the tube 6 and the positive terminal of a source of unidirectional energy such as a battery 12. The coil 9 forms the primary winding of an intermediate frequency transformer 13 and is inductively coupled to a coil 14 forming the secondary winding of the intermediate frequency transformer. The secondary coil 14 also is shunted by a resonating capacitor 15 and is coupled to an intermediate frequency amplifier 16. The coil 14 and its resonating capacitor 15 form another resonant circuit 17, which, together with the output resonant circuit 8, is tuned to the intermediate frequency.

There also is provided an oscillator resonant circuit 18, comprising a tapped coil 19 and a shunt-connected, variable resonating capacitor 20. The resonant circuit 18 may be tuned to a desired oscillator frequency which, when combined with the radio frequency of the received carrier waves, will invariably develop the fixed intermediate frequency. The variable radio frequency input circuit capacitor 5 and the variable oscillator circuit capacitor 20 may be mechanically interconnected as indicated by the broken line 21, for unicontrol. The high potential terminal of the oscillator resonant circuit 18 is coupled by means of the parallel arrangement of a capacitor 22 and a resistor 23 to the oscillator grid 24 of the tube 6. The low potential terminal of the oscillator resonant circuit 18 is coupled to the grounded negative terminal of the battery 12, the positive terminal of which is connected by a decoupling resistor 25 to the screen grids 26 and 27 of the tube 6. The grid 26 serves as the oscillator anode. An intermediate tap 28 on the oscillator coil 19 is connected to the cathode 29 of the tube 6, and the suppressor grid 30 of the tube 6 is conventionally connected to ground.

In accordance with an important feature of the invention, the screen grids 26 and 27, instead of being conventionally coupled by a capacitor 31 to ground, are coupled by means of this capacitor to an intermediate point 32 on the radio frequency input circuit coil 4.

In operation, the frequency converter system, in accordance with the present invention, operates in a somewhat conventional manner. It will be noted that the local oscillator is of the Hartley type, wherein the frequency-determining circuit comprising the oscillator resonant circuit 18 is coupled between the oscillator grid 24 and the oscillator anode 26, with the cathode 29 being connected to an intermediate point 28 on the coil 19. Also, it will be noted that the radio frequency input resonant circuit 3 is somewhat similarly coupled between the signal grid 7 and the output anode 11. According to the presently accepted theory of operation of pentagrid converters, there is formed, between the grid 26, serving as the oscillator anode, and the signal grid 7, a virtual cathode which pulsates at the oscillator frequency. In effect, this virtual cathode is the source of electrons for the signal-detecting portion of the tube 6 which includes the signal grid 7 and the output anode 11. By coupling the grid 26 to an intermediate point 32 on the input resonant circuit coil 4, there is, in effect, provided for the signal detector a circuit arrangement resembling that of a Hartley oscillator. Thus, there is a regenerative feedback provided from the anode 11 to the signal grid 7. Inasmuch as it is not desired to have this circuit function to produce oscillations at the signal frequency, the point 32 is selected so that the potential thereat is of insufficient magnitude to cause oscillation. This potential, however, preferably should be of sufficient magnitude to produce appreciable regeneration at the signal frequency.

As a result of the regeneration provided by means of the feedback coupling to the input resonant circuit coil 4, it is possible to effect considerably higher conversion gains with a system of this character. It, therefore, is not necessary to provide as much signal amplification as is required in more conventional systems. Furthermore, it will be noted that these beneficial results are obtained without adding to the cost of producing the radio receiver. The coupling capacitor 31 is ordinarily used to couple the screen grids 26 and 27 to ground. In order to effect the regenerative feedback, whereby to increase the efficiency of the frequency converter, it merely is necessary to connect the capacitor 31 to an intermediate point on the coil 4, instead of to ground.

Thus, it may be seen that, by modifying a conventional frequency converter in accordance with the present invention, it may be possible to so increase the frequency conversion gain as to eliminate entirely, in some cases, one stage of signal amplification. In such an event a material saving may be effected in production cost. In any case, whether a stage of signal amplification may be eliminated or not, there is effected a material improvement in the operation of the radio receiver embodying the invention.

What is claimed is:

1. A frequency converter system, comprising, an electron discharge local oscillator and frequency converter device having a cathode, an oscillator grid, an oscillator anode, a signal grid and an output anode, an input resonant circuit tunable to a desired frequency and being connected between said signal grid and a point of fixed reference potential, a frequency-determining circuit tunable to a predetermined oscillator frequency and coupled between said oscillator anode and said oscillator grid and to said point of fixed potential, said cathode being connected to an intermediate point of said frequency determining circuit, an output resonant circuit tuned to an intermediate frequency and coupled to said output anode, and a regenerative circuit connection between said oscillator anode to said input resonant circuit at a point above said point of fixed reference potential.

2. A frequency converter system as defined in claim 1, wherein said input resonant circuit comprises an inductance device, said signal grid being coupled to a relatively high potential point on said inductance device and said oscillator anode being coupled to a relatively low potential point on said inductance device.

3. A frequency converter system as defined in claim 2, wherein said oscillator anode coupling is to a point on said inductance device having a potential which is of insufficient magnitude to produce oscillations at said signal frequency but is of sufficient magnitude to effect appreciable regeneration at said signal frequency.

4. In a frequency converter system, a pentagrid converter type electron discharge device having a cathode, a signal input grid, an oscillator grid, a signal output anode and an oscillator anode, a signal input resonant circuit coupled between said signal grid and a point of fixed reference potential, a frequency-determining resonant circuit coupled between said oscillator grid and said oscillator anode and to said point of fixed potential, said cathode being connected to an intermediate point of said frequency determining circuit, and a regenerative circuit connection between said oscillator anode and an intermediate point of said input resonant circuit.

5. A frequency converter system as defined in claim 4 wherein said cathode is coupled to an intermediate point of said frequency-determining resonant circuit.

6. A frequency converter system as defined in claim 4 wherein said circuit connection includes a coupling capacitor.

7. A frequency converter system as defined in claim 4 wherein a signal output resonant circuit is coupled between said oscillator anode and said signal output anode.

BENJAMIN S. VILKOMERSON.

References Cited in the file of this patent

UNITED STATES PATENTS

| Number | Name | Date |
|---|---|---|
| 2,033,986 | Harris | Mar. 17, 1936 |
| 2,042,571 | Wheeler | June 2, 1936 |
| 2,050,474 | Stone | Aug. 11, 1936 |
| 2,079,655 | Markus | May 11, 1937 |
| 2,111,764 | Foster | Mar. 22, 1938 |
| 2,122,283 | Harris | June 28, 1938 |
| 2,125,003 | Harries | July 26, 1938 |
| 2,309,031 | Worchester | Jan. 19, 1943 |

OTHER REFERENCES

Official Radio Service Manual Radcraft Publication, Inc., April 28, 1939, page 266.